(12) United States Patent
Baxter et al.

(10) Patent No.: US 6,872,601 B1
(45) Date of Patent: Mar. 29, 2005

(54) METHOD AND APPARATUS FOR TIMING MANAGEMENT IN A CONVERTED DESIGN

(75) Inventors: Glenn A. Baxter, Los Gatos, CA (US); Andy H. Gan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 81 days.

(21) Appl. No.: 10/632,168

(22) Filed: Jul. 30, 2003

Related U.S. Application Data

(62) Division of application No. 09/374,399, filed on Aug. 13, 1999, now Pat. No. 6,625,787.

(51) Int. Cl.[7] ............................................. H01L 21/82
(52) U.S. Cl. .................... 438/129; 438/128; 438/14; 716/6
(58) Field of Search ................. 438/14, 10, 4, 438/17, 128, 129, 130; 716/6

(56) References Cited

U.S. PATENT DOCUMENTS

| | | | |
|---|---|---|---|
| 4,918,614 A | 4/1990 | Modarres et al. | |
| 5,095,352 A | 3/1992 | Noda et al. | |
| 5,469,003 A | 11/1995 | Kean | |
| 5,523,984 A | 6/1996 | Sato et al. | |
| 5,726,903 A | 3/1998 | Kerzman et al. | |
| 5,815,405 A | 9/1998 | Baxter | |
| 5,856,927 A | 1/1999 | Greidinger et al. | |
| 5,861,761 A | 1/1999 | Kean | |
| 5,870,313 A | 2/1999 | Boyle et al. | |
| 5,903,461 A | 5/1999 | Rostoker et al. | |
| 5,914,887 A | 6/1999 | Scepanovic et al. | |
| 6,133,053 A | * 10/2000 | Wright et al. | ................... 438/14 |
| 6,155,725 A | 12/2000 | Scepanovic et al. | |
| 6,197,620 B1 | * 3/2001 | Merritt | ........................ 438/129 |
| 6,233,722 B1 | * 5/2001 | LaBerge | ........................ 438/129 |
| 6,308,309 B1 | * 10/2001 | Gan et al. | ........................ 716/8 |
| 6,442,739 B1 | 8/2002 | Palermo et al. | |
| 6,496,035 B2 | * 12/2002 | Jensen et al. | ................ 438/128 |
| 6,523,161 B1 | * 2/2003 | Gopalakrishnan et al. | ... 438/129 |

FOREIGN PATENT DOCUMENTS

JP          410074840         3/1998

\* cited by examiner

*Primary Examiner*—Kevin M. Picardat
(74) *Attorney, Agent, or Firm*—Arthur Joseph Behiel

(57) ABSTRACT

Described is a method of converting one representation of a circuit into another. For example, a first network representation adapted for use with an FPGA can be converted into a second network representation adapted for use in a mask-programmable gate array. The method begins with accessing the first network representation, such as a netlist, and identifying signal paths that might be sensitive to race conditions. Representations of delay elements are then inserted into each sensitive signal path. The timing of the modified network representation is then modeled by calculating the delays associated with each signal path. Any differences in the modeled delay values are minimized by modifying one or more of the inserted delay-element representations. In one embodiment, the inserted delay-element representations include stopper cells that maintain the nets to and/or from the delay-element representations. Delay-element representations can therefore be modified without altering the circuit timing of related net segments.

6 Claims, 7 Drawing Sheets

509

| CK | A | | | | | | | B | C | | | | | D | | |
|---|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 1 | 0 | 0 | 0 | 0 | 0 | 0 |
| 1 | 0 | 0 | 0 | 0 | 0 | 0 | 0 | 0 | 1 | 0 | 0 | 0 | 0 | 0 | 0 |
| 1 | 0 | 0 | 0 | 0 | 0 | 0 | 0 | 0 | 1 | 0 | 1 | 0 | 0 | 0 | 0 |
| 1 | 0 | 0 | 0 | 0 | 0 | 0 | 0 | 0 | 1 | 1 | 1 | 0 | 0 | 0 | 0 |
| 1 | 0 | 0 | 0 | 0 | 0 | 0 | 0 | 1 | 1 | 1 | 1 | 0 | 0 | 0 | 0 |
| 1 | 0 | 0 | 0 | 0 | 0 | 0 | 0 | 1 | 1 | 1 | 1 | 0 | 0 | 0 | 0 |
| 1 | 0 | 0 | 0 | 0 | 0 | 0 | 0 | 1 | 1 | 1 | 1 | 1 | 0 | 0 | 0 |
| 1 | 0 | 0 | 0 | 0 | 0 | 0 | 0 | 1 | 1 | 1 | 1 | 1 | 0 | 0 | 0 |
| 1 | 0 | 0 | 0 | 0 | 0 | 0 | 0 | 1 | 1 | 1 | 1 | 1 | 0 | 0 | 0 |
| 1 | 0 | 0 | 0 | 0 | 0 | 0 | 0 | 1 | 1 | 1 | 1 | 1 | 0 | 1 | 0 |
| 1 | 0 | 0 | 0 | 0 | 0 | 0 | 0 | 1 | 1 | 1 | 1 | 1 | 0 | 1 | 0 |
| 1 | 0 | 0 | 0 | 0 | 0 | 0 | 0 | 1 | 1 | 1 | 1 | 1 | 0 | 1 | 0 |
| 1 | 0 | 0 | 0 | 0 | 0 | 0 | 0 | 1 | 1 | 1 | 1 | 1 | 0 | 1 | 0 |
| 1 | 0 | 0 | 0 | 0 | 0 | 0 | 0 | 1 | 1 | 1 | 1 | 1 | 0 | 1 | 0 |
| 1 | 0 | 0 | 0 | 0 | 0 | 0 | 0 | 1 | 1 | 1 | 1 | 1 | 0 | 1 | 0 |
| 1 | 0 | 0 | 0 | 0 | 0 | 0 | 0 | 1 | 1 | 1 | 1 | 1 | 0 | 1 | 0 |
| 1 | 1 | 0 | 0 | 0 | 0 | 0 | 0 | 1 | 1 | 1 | 1 | 1 | 0 | 1 | 0 |
| 1 | 1 | 0 | 0 | 0 | 0 | 0 | 0 | 1 | 1 | 1 | 1 | 1 | 0 | 1 | 1 |

FIG. 5B

METHOD AND APPARATUS FOR TIMING MANAGEMENT IN A CONVERTED DESIGN

This application is a divisional of U.S. patent application Ser. No. 09/374,399, filed on 13 Aug. 1999, now U.S. Pat. No. 6,625,787.

FIELD OF THE INVENTION

This invention relates to the field of circuit design. In particular, the invention relates to a method and apparatus for converting a programmable-logic-device representation of a circuit into a second representation of the circuit, such as a representation for implementing the circuit on a mask-programmable gate array.

BACKGROUND OF THE INVENTION

Programmable logic devices (PLDs) are a well-known type of digital integrated circuit that may be programmed by a user (e.g., a circuit designer) to perform specified logic functions. One type of PLD, the field-programmable gate array (FPGA), typically includes an array of configurable logic blocks (CLBs) that are programmably interconnected to each other and to programmable input/output blocks (IOBs). This collection of configurable logic may be customized by loading configuration data into internal configuration memory cells that define how the CLBS, interconnections, and IOBs are configured.

The ease with which a given logic function can be implemented using a PLD makes PLDs very inexpensive in small quantities. In contrast, application-specific integrated circuits (ASICs) are more expensive to implement a given design, but less expensive to produce in large quantities. Thus, where economies of scale warrant, a vendor may want to design and implement a logic circuit using a PLD, taking advantage of the ease of design and the attendant reduction in time to market. Then, if economies of scale warrant, the vendor may convert the PLD design into a design specification for another type of integrated circuit, such as a mask programmed integrated circuit (MPIC). This conversion process may be to a simple mask programmed version of the PLD, or a totally different representation.

FIG. 1 illustrates a system 100 in which a PLD 102 is removed from an IC site 104 and replaced with a new integrated circuit 106 having the same functionality as PLD 102. PLD 102 conventionally includes a collection of configurable elements 108 that are programmed to perform the functions of a circuit design 110. The new integrated circuit 106, a mask-programmable gate array, for example, includes design implementation logic 112 that also performs the functions of circuit design 110.

FIG. 2 illustrates a method of converting a PLD representation of circuit design 110 of FIG. 1 into a second representation for use with a different implementation technology (the "target technology"). Beginning with step 210, a user enters a text or graphic description of circuit design 110 using a software tool, such as the ViewDraw™ tool available from ViewLogic, Inc., of Milpitas, Calif. Next, in step 212, the software tool then creates a design description 214. Design description 214 may include, for example, a conventional hardware-description language (HDL) or netlist description of circuit design 110.

PLDs require custom circuit representations suited for use in specific PLD architectures. Data for implementing design 110 on a specific PLD is therefore generated at step 215. These data include a new netlist representation 217 of circuit design 110 and a bit-wise representation of circuit design 110, i.e., bitstream 218. Netlist 217 and bitstream 218 may be generated using, for example, the XACT™ software, version 5.0, provided by Xilinx, Inc., having an address at 2100 Logic Drive, San Jose, Calif.

Next, in step 220, the information for programming the group of configurable elements 108 in PLD 102 is parsed from netlist 217 and/or bitstream 218. The parsing step organizes the data in bitstream 218 to produce an element identifier 221 and element programs 225. Element identifier 221 uniquely identifies each programmable element in the new integrated circuit 106 and element programs 225 specifies the configuration of those programmable elements. For example, one set of bits from bitstream 218 programs a Configurable Logic Block (CLB) of an FPGA, another set of bits, from the same bitstream 118, identifies and programs an Input/Output Block (IOB) of the FPGA, while yet another set of bits configures the interconnections between the CLB and the IOB.

A pre-compile representation 237 of the PLD representation of circuit design 110 is built during step 230. Step 230 may include generating an HDL file that includes several instances of different general models. Each instance of a general model corresponds to a different type of configurable element in PLD 102. Element identifier 221 identifies the type of general model to use (e.g., an IOB general model, a CLB general model, or an interconnection element general model) for each programmable element in new integrated circuit 106. The corresponding element program 225 defines some parameters for the instance of the general model, e.g., which circuits to include in a given instance of a general model.

At step 240, a compiler converts the pre-compile representation 237 into a post-compile representation 247. The pre-compile representation 237 includes an accurate representation of circuit design 110 in PLD 102. However, pre-compile representation 237 also includes a number of unnecessary structures. For example, if a given instance of an input/output block general model is defined as an input port (the parameters to that instance define the instance as an input port), then the structures in that instance that implement output functions are not necessary. The compile step 240 removes the unnecessary structures. In one embodiment, the compiler is a Synopsys Design Compiler>, available from Synopsys, Inc., of Mountain View, Calif. The compiler uses the a fabrication technology library 242 for the target technology to generate the post-compile representation 247.

At step 250, a place and route tool is used to place and route the post-compile representation 247 in the target technology. An exemplary place and route tool is Gate Ensemble™ from Cadence Systems, Inc., of Santa Clara, Calif. Step 250 produces a specification for fabrication 255, typically a magnetic tape written in Caltech Intermediate Format (CIF, a public domain text format) or GDSII Stream (formerly also called Calma Stream, now Cadence Stream). At step 260, from the specification for fabrication 255, a semiconductor foundry manufactures the new integrated circuit 106 that functions as specified by circuit design 110.

For a detailed description of exemplary methods and apparatus for converting PLD circuit designs for use in other circuit technologies, see U.S. Pat. No. 5,815,405, entitled "Method and Apparatus for Converting a Programmable Logic Device Representation of a Circuit into a Second Representation of the Circuit," by Glenn A. Baxter, issued Sep. 29, 1998, which is incorporated herein by reference.

The design engineer responsible for converting a PLD design for use with a target technology must verify the operation of the converted design to ensure that the new implementation is functionally equivalent to the PLD implementation. This is particularly important because the fabrication technology used to fabricate the new integrated circuit 106 affects the speed of the device. Thus, even though all of circuit design 110, as implemented in the PLD 102, is completely defined in design implementation logic 103, the speed of the new integrated circuit 106 may be significantly different than that of PLD 102. These speed differences may result in malfunctions because of race conditions and other timing-related problems.

FIG. 3 depicts a conventional clock tree 300 used to illustrate potential timing problems in converted designs. Clock tree 300 includes a net 310 that distributes a clock signal on terminal TCLK to a number of clock branches A–M. Each of clock branches A–M connects to one or more destination circuits, as indicated by the annotations provided for each clock branch. For example, clock branch E connects to 17 destination circuits.

One line from clock branch A and another line from clock branch D connect to the clock terminals of respective flip-flops 305 and 310, which are exemplary destination circuits. Ideally, clock signals provided on clock terminal CLK should arrive at the clock terminals of flip-flops 305 and 310 (and the other destination circuits) at approximately the same time. Otherwise, time-dependent data can be corrupted. For example, if flip-flop 310 clocks before flip-flop 305, then flip-flop 310 may capture data before that data is available from flip-flop 305, the result being that flip-flop 310 could contain incorrect data.

Ensuring that each destination circuit receives clock signals at approximately the same time is difficult because of the myriad combinations of paths that make up a typical clock tree. These paths include interconnected lines of different lengths and intervening components, therefore each path has some associated delay. The delays of the various signal paths within net 310 should therefore be balanced to ensure fast, error-free circuit operation.

The traditional method of balancing signal paths within a given circuit includes simulating circuit operation and monitoring the results at selected circuit nodes for errors. Such errors, combined with an understanding of the intended function of the circuit, enable test engineers to identify problem paths. Once the problem signal paths are located, the netlist is changed to alter the offending paths. For example, if a clock signal arrives too late to capture some data, either the clock signal or the data line can be rerouted to change the relative delays.

The trouble with the conventional approach is two fold. First, identifying problem paths by simulating circuit operation requires an intimate knowledge of the logic being implemented. A user must therefore understand the functionality of a given circuit to perform a conversion from one circuit technology to another. Second, each signal path of a given net may be related to others. Thus, rerouting a signal path to solve one problem can change the delays of many other paths, and thereby introduce new timing errors. The new errors must, in turn, be corrected, which can introduce still other timing errors. Balancing signal paths is therefore an iterative and often very time-consuming process. What is needed is a more efficient method of converting one representation of a circuit into another, preferably without requiring those responsible for the conversion to understand the function of the circuit.

SUMMARY

The present invention is directed to an efficient method of converting one representation of a circuit into another. For example, a first network representation adapted for use with an FPGA can be easily converted into a second representation adapted for use in a mask-programmable gate array. The method of the present invention so simplifies the conversion process that those responsible for the conversion need not have a detailed understanding of the circuit.

The method begins with accessing the first network representation, such as a netlist, and identifying signal paths that might be sensitive to race conditions. Such signal paths might be a number of clock or data paths that connect between a signal source and a number of signal destinations. Representations of delay elements are then inserted into each sensitive signal path.

Once delay-element representations are inserted into the network representation, the timing of the new network representation is modeled by calculating the delays associated with each signal path. Any differences in the modeled delay values are minimized by modifying one or more of the delay-element representations.

The components of the network representation are placed and routed once the signal paths are sufficiently balanced. The resulting circuit specification includes additional timing information, allowing the netlist to be back-annotated with more precise timing estimates. The timing of the back-annotated network representation is then modeled once again. The delay-element representations may be modified again at this stage as required to balance the signal paths of interest.

Conventional routing tools reroute nets associated with components that are modified, removed, or replaced. Modifying delay elements to balance signal paths can therefore initiate a reroute that introduces new timing errors. One embodiment of the invention avoids this problem by bounding each delay element, on one or both sides, with a place-holding cell, or "stopper cell." The stopper cells maintain the nets to and/or from the delay elements so that modifying a delay element does not affect the routing to and from the delay element.

Each stopper cell and delay element introduces some delay into the associated signal path. In some cases, this delay should be as small as possible, for example, where the delay associated with a given signal path should be minimized. In such situations, the present invention employs a specialized stopper cell that occupies very little area and introduces a minimal amount of delay. In one embodiment, this specialized stopper cell is a library element that defines a conductive segment between a pair of ports, and that does not connect to any active circuit components within the cell. The simple design allows the stopper cell to be made very small, and the conductive segment introduces very little signal propagation delay.

BRIEF DESCRIPTION OF THE FIGURES

FIG. 5B depicts a portion of an illustrative log file 509 generated in step 508 of FIG. 5A.

DETAILED DESCRIPTION

Figure 3:
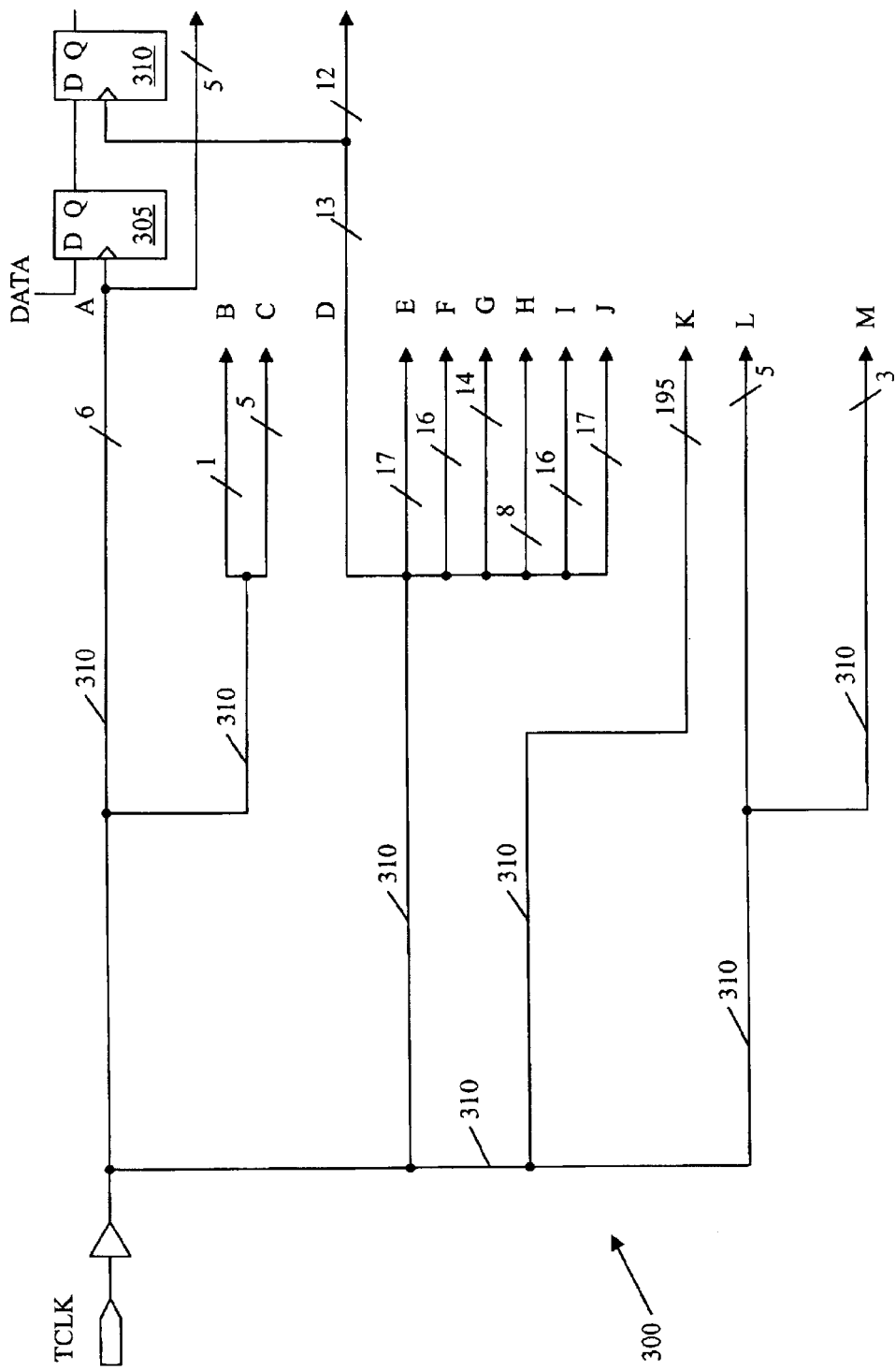
FIG. 3 depicts a conventional clock tree 300 used to illustrate potential timing problems in converted designs. Clock tree 300 includes a net 310 that distributes a clock on terminal CLK to a number of clock branches A–M.
Figure 4A:
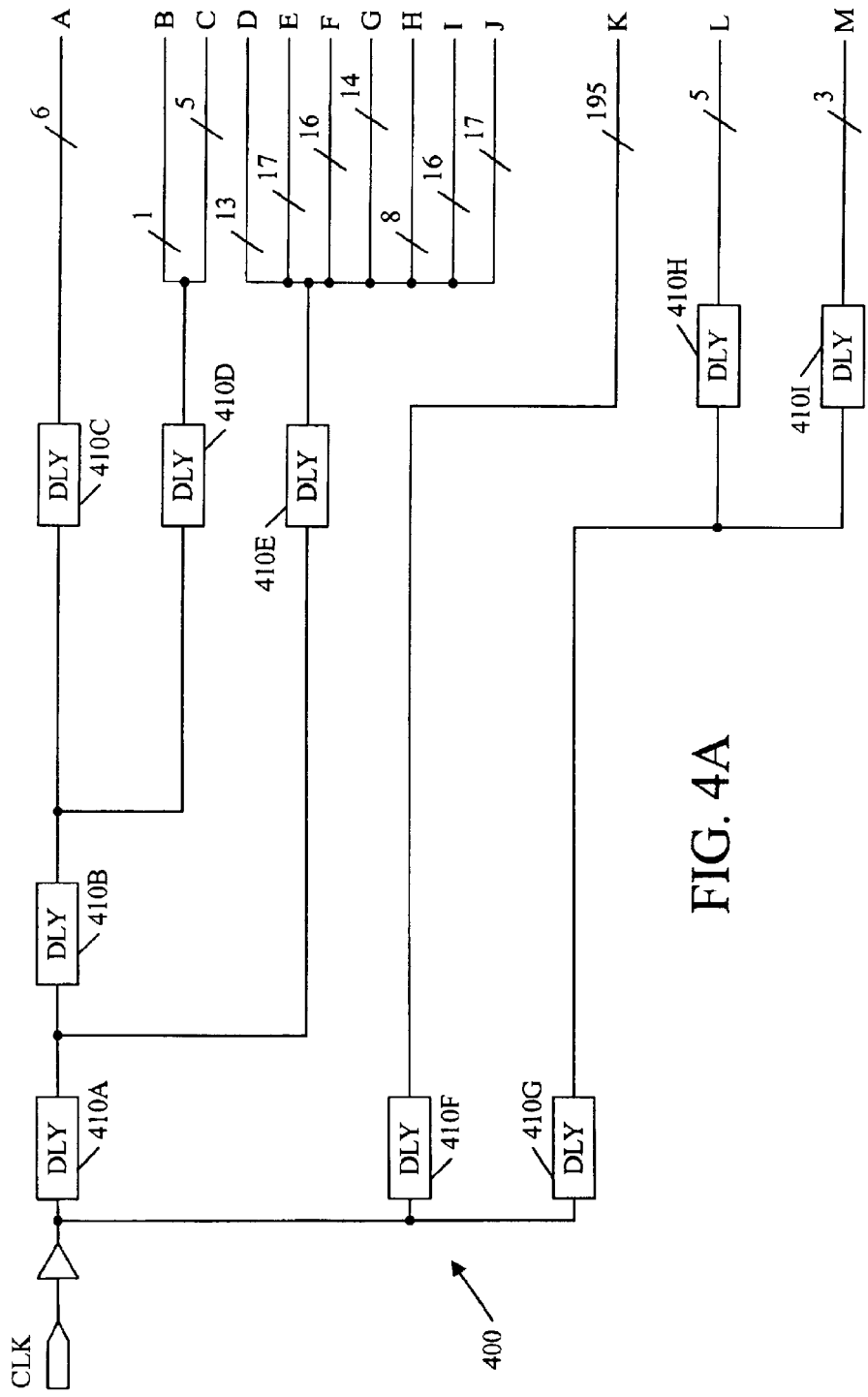
FIG. 4A depicts a clock tree 400 in accordance with the invention.

FIG. 4A depicts a clock tree 400 in accordance with the invention that distributes a clock signal on a terminal CLK to a number of clock branches A–M. Like clock tree 300 of FIG. 3, each of clock branches A–M is connected to one or more destination circuits (e.g., flip-flops). For example, clock branch E connects to 17 destination circuits. Unlike the conventional clock tree 300, however, clock tree 400 includes a number of programmable delay elements 410A–410I inserted into various net segments of clock tree 400.

Delay elements 410A–410I are incorporated into a circuit netlist to define delay-inducing components. Delay elements 410A–410I might include different numbers and sizes of buffers and inverters, for example. Delay elements 410A–410I can be individually modified in accordance with the invention to balance the delays associated with each of clock branches A–M, thereby reducing the total clock skew of clock tree 400.

Delay elements 410A–410I are so-called "soft macros," which are groups of hard library elements incorporated into a circuit netlist. Hard library elements can change position on a die during place and route, but the relative locations of the transistors and wiring inside the library elements are fixed. In contrast, soft macro contain only connection information, so that the placement and wiring of soft macros can vary during place and route.

Figure 4C:
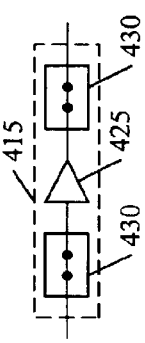
FIG. 4C depicts an exemplary inverting delay element 420.
Figure 4B:
FIG. 4B depicts an exemplary non-inverting delay element 415.

FIG. 4B depicts an exemplary non-inverting delay element 415, and FIG. 4C depicts an exemplary inverting delay element 420. Delay element 415 includes a buffer 425 bounded by a pair of specialized place-holding cells, or "stopper cells," 430. Delay element 420 includes an inverter 435 and a pair of stopper cells 440. Recalling that conventional routers reroute nets associated with net components that are modified, removed, or replaced, stopper cells 430 and 440 maintain the nets to and/or from each delay element 410A–410I when the delay component associated with a given delay element (e.g., buffer 425) is modified, removed, or replaced.

Figure 1:
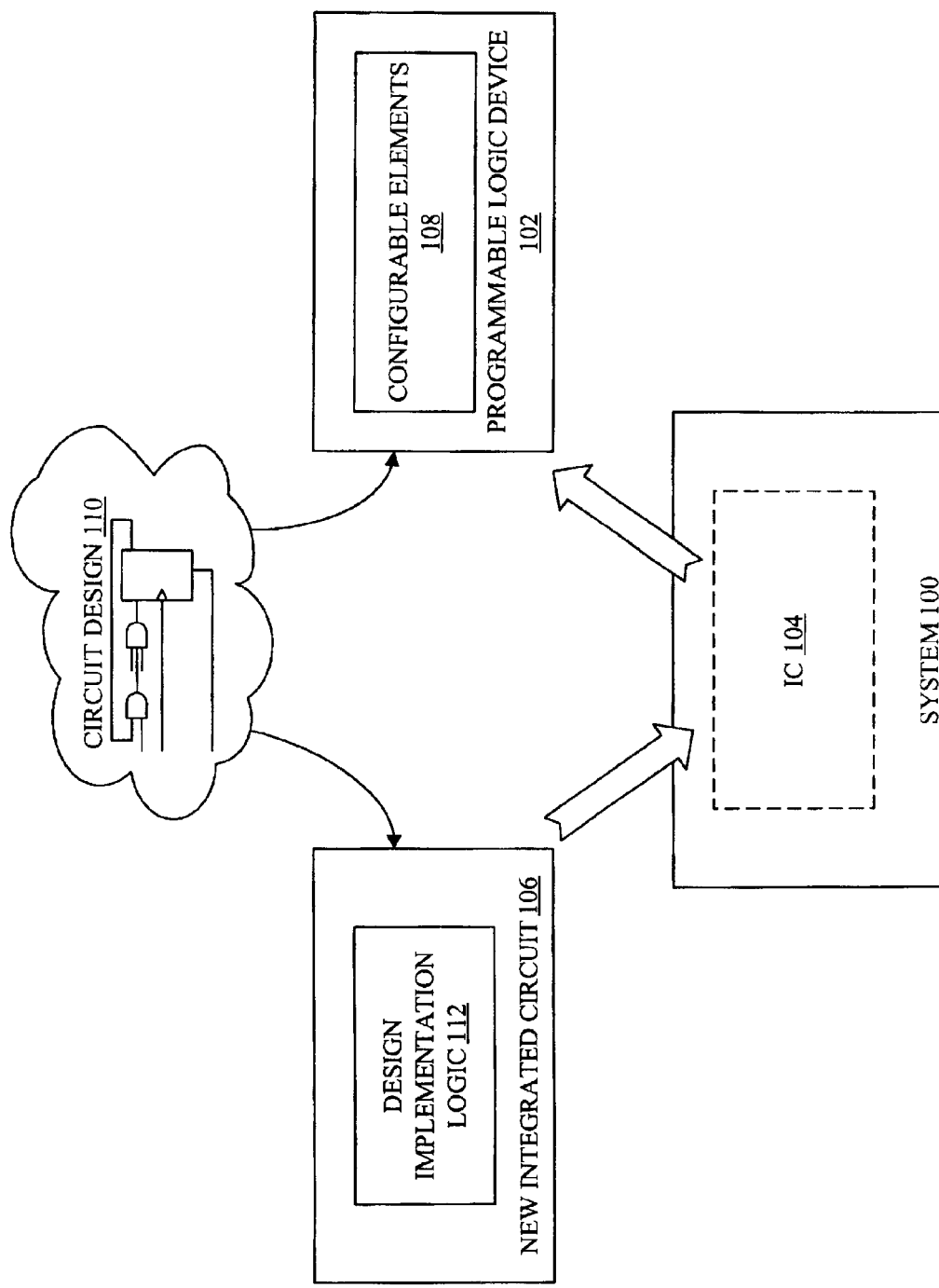
FIG. 1 illustrates a system 100 in which a PLD 102 is removed from an IC cite 104 and replaced with a new integrated circuit 106 having the same functionality of PLD 102.
Figure 2:
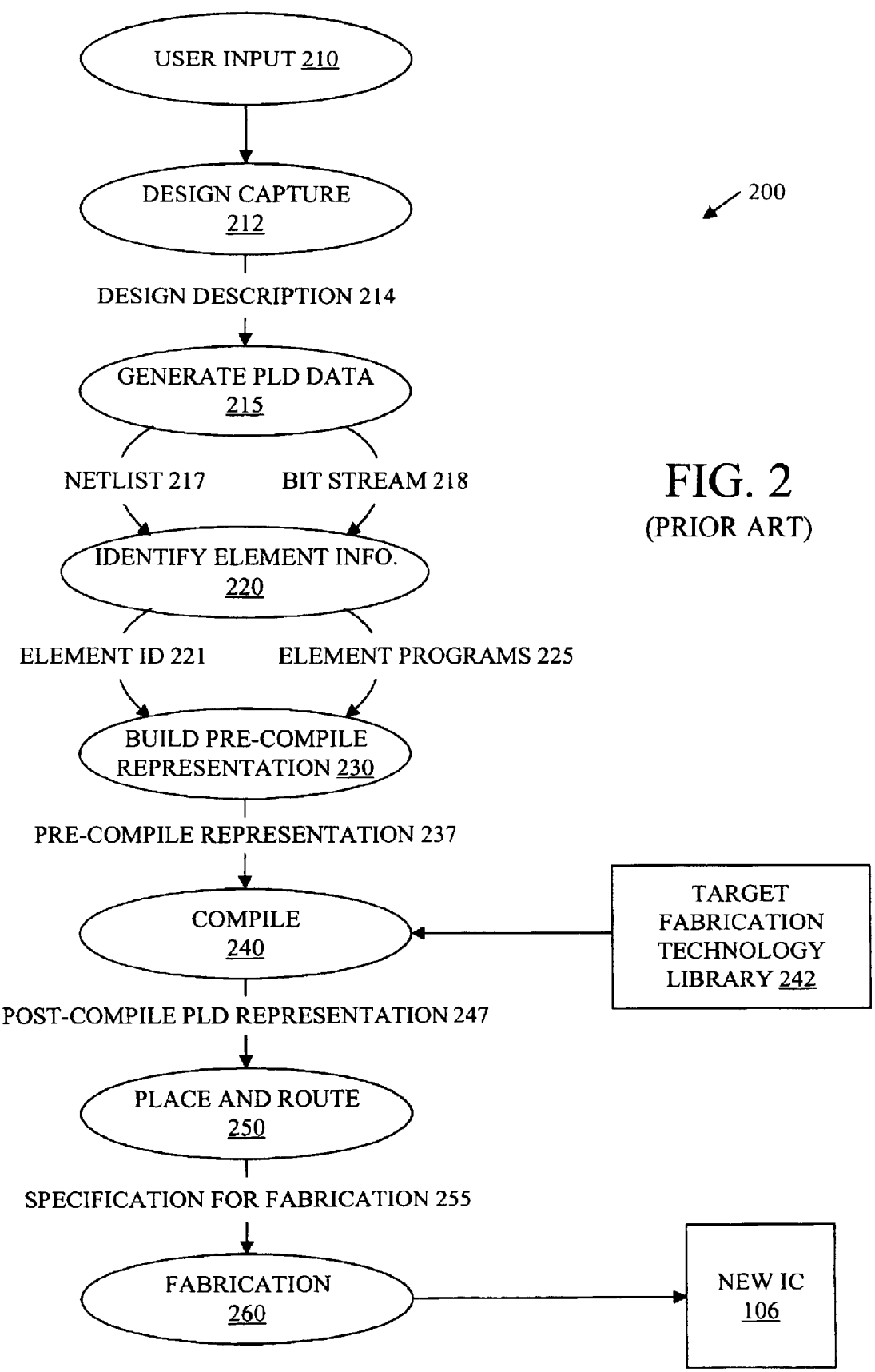
FIG. 2 illustrates a method of converting a PLD representation of circuit design 110 into a second representation for use with a different implementation technology (the "target technology").
Figure 5A:
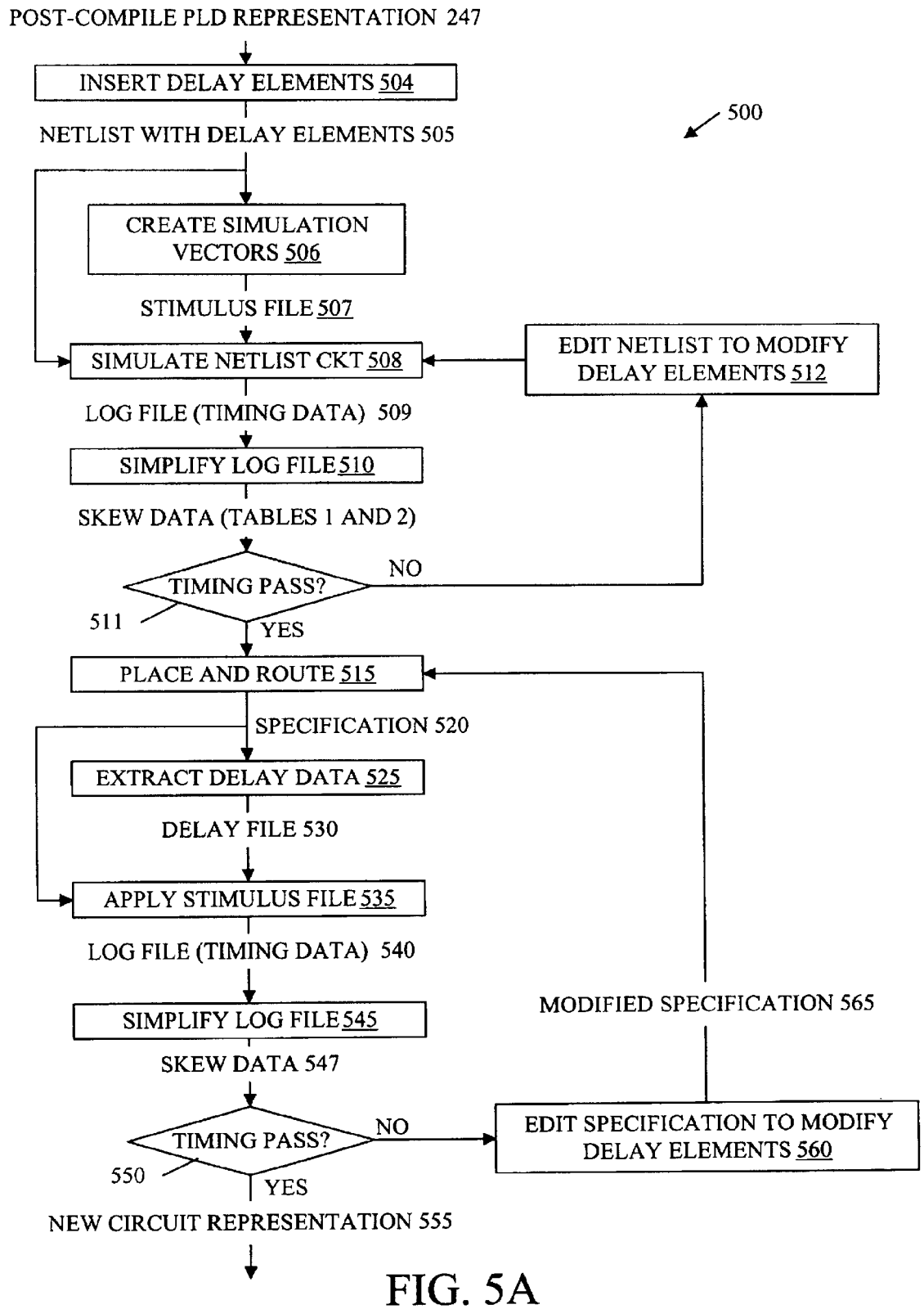
FIG. 5A is a flowchart depicting a process 500 of inserting and adjusting delay elements 410A–I to balance clock branches A–M of FIG. 4.

FIG. 5A is a flowchart depicting a process 500 of inserting and adjusting delay elements 410A–I to balance clock branches A–M of FIG. 4. Process 500 starts with post-compile PLD representation 247 (FIG. 2), which is a netlist defining the function of the new integrated circuit implemented in the target technology. Delay elements 410A–I are added to this netlist as additional soft macros that represent delay elements (step 504). The resulting netlist 505 is functionally equivalent to post-compile representation 247. An attempt can be made in step 504 to balance the delays associated with clock branches A–M by using relatively fast delay elements to drive heavily loaded clock branches and relatively slow delay elements to drive lightly loaded clock branches.

In step 506, a test program creates simulation vectors for simulating the clock timing relationships defined in netlist 505. Stimulus file 507 is the result of step 506. Stimulus file 507 contains vectors that cause positive and negative clock transitions at each clock destination. When simulated in step 508, stimulus file 507 causes clock timing information to be logged in a log file 509.

Step 508 is a pre-layout simulation that takes into account logic-cell delays and, in some cases, estimated interconnect delays. In the example of FIG. 4, the delays associated with each clock destination are calculated for test vectors applied to clock terminal CLK. For example, if each clock destination is the clock terminal of a respective destination flip-flop, then test vectors are developed to calculate the time and state of each destination flip-flop.

FIG. 5B depicts a portion of an illustrative log file 509 generated in step 508 of FIG. 5A. Each row of log file 509 represents a change in the state of the clock on terminal CLK or of the output of one or more destination circuit. Each row includes a time stamp (not shown) indicating the time at which one of the data points in the row changed state. In FIG. 5B:

1. column 1, labeled CK, represents the state of clock terminal CLK;
2. columns 2–7 represent the output levels from each of the six destination circuits (e.g., flip-flops) associated with clock branch A;
3. column 8 represents the output level from the one destination circuit associated with clock branch B; and
4. columns 9–13 represent the output levels from each of the five destination circuits associated with clock branch C.

For ease of analysis, log file 509 is formatted so that all destinations of a given clock branch (e.g., destinations A1–A7) are grouped together. Clock branch D is only partially illustrated and the remaining clock branches E–M are omitted for brevity.

Referring to column one, clock terminal CLK transitions to a logic one at time TCLK. The outputs of the various destination circuits are monitored (e.g., captured at discrete time intervals) in the simulation to determine when they change in response to the clock. The first change occurs in column 10 at time C1, so called because it is the first instance of a change associated with clock branch C. As time progresses, the remaining destinations of clock branch C change at times C2–C5, two destinations of clock branch D change at times D1 and D2, and one destination associated with clock branch A changes at time A1. Step 508 continues until all destinations have changed.

Log file 509 includes all of the timing information needed to estimate the clock skews associated with each of clock branches A–M. However, such log files are typically very large, often hundreds of megabytes, and consequently unwieldy for human operators. Log file 509 is therefore simplified in step 510 into the formats illustrated in Tables 1 and 2.

TABLE 1

| BRANCH | EDGE | LOADS | LCOL | RCOL | MINΔ | MAXΔ | MAX − MIN |
|---|---|---|---|---|---|---|---|
| A | R | 6 | 2 | 7 | 7657 | 8027 | 370 |
| B | R | 1 | 8 | 8 | 7761 | 7761 | 0 |
| C | R | 5 | 9 | 13 | 7355 | 7431 | 76 |
| D | R | 13 | 14 | 26 | 7561 | 7757 | 196 |
| E | R | 17 | 27 | 43 | 7983 | 8101 | 118 |
| F | R | 16 | 44 | 59 | 7880 | 8357 | 477 |
| G | R | 14 | 60 | 73 | 7804 | 8185 | 301 |
| H | F | 8 | 74 | 81 | 7805 | 7977 | 172 |
| I | R | 16 | 82 | 97 | 7775 | 8102 | 327 |
| J | R | 17 | 98 | 114 | 7715 | 8339 | 624 |
| K | F | 195 | 115 | 309 | 7594 | 7940 | 346 |
| L | F | 5 | 310 | 314 | 7703 | 8862 | 1159 |
| M | R | 3 | 315 | 317 | 7479 | 7563 | 84 |

Table 1 is a summary of the information provided in log file 509 of FIG. 5B. The various columns of Table 1 are defined as follows:

1. "BRANCH" identifies each clock branch A–M;

2. "EDGE" identifies whether the destination circuit changed states in response to a rising (R) or falling (F) clock edge;

3. "LOADS" lists the number of loads, or destination circuits, associated with a given clock branch;

4. "LCOL," for "left-column," identifies the left-most column in log file 540 that corresponds to a given clock branch;

5. "RCOL," for "right-column," identifies the right-most column in log file 540 that corresponds to a given clock branch;

6. "MINΔ" lists the elapsed time between time CLK and the time at which the first load associated with a given clock branch changes state (i.e., the shortest signal-propagation delay from clock terminal CLK to the output of a destination circuit on a given clock branch);

7. "MAXΔ" lists the elapsed time between time CLK and the time at which the last load associated with a given clock branch changes state; and 8. "MAX−MIN" is the difference between MINΔ and MAXΔ, and represents the clock skew for a given branch.

Reducing log file 509 into Table 1 provides a user with a simple means of analyzing the timing information provided in log file 509.

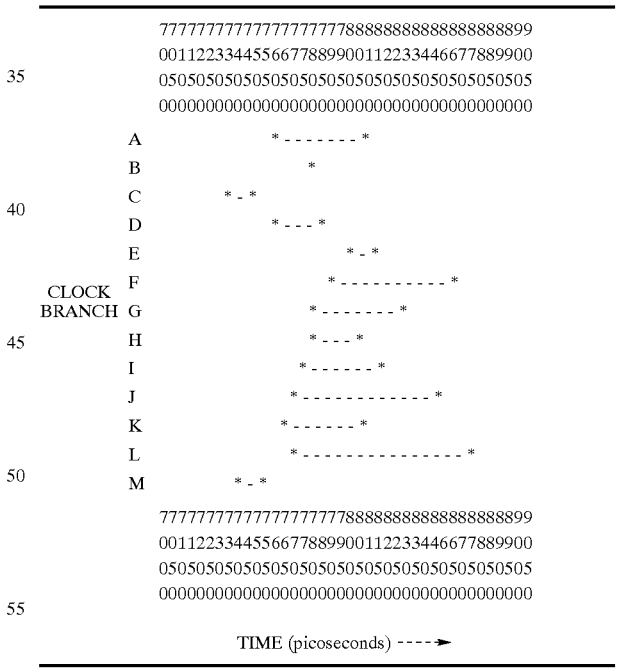

TABLE 2

TIME (picoseconds) ---->

Table 2 graphically depicts a portion of the data provided by log file 509. For each clock branch A–M, Table 2 shows time stamps—plotted as asterisks—associated with the first and last destination circuits to responds to the clock signal on line CLK during the simulation of step 508. These two extreme positions define the simulated clock skew for a given clock branch. For example, the fastest destination circuit of clock branch A responded in about 7600 ps, while the slowest destination circuit of clock branch A responded in about 8000 ps. Thus, clock branch A has a clock skew of 8000 ps minus 7600 ps, or 400 ps. Table 1 shows a more precise estimate of clock skew, and lists the clock skew of branch A as 370 ps.

Clock skew varies with supply-voltage and temperature and can be different for rising and falling clock edges. Thus, some embodiments collect four sets of data similar to that of Table 2: rising- and falling-edge skew data for best- and worst-case voltage and temperature conditions. In the example, the data of Table 2 is assumed to be the worst case skew data. The skew data for the three other sets of conditions are omitted here for brevity.

Referring again to FIG. 5A, the next step 511 is to determine whether the total clock skew is sufficiently short. A user can perform step 511 visually using the data of Tables 1 and 2. If the total skew is sufficiently short, then the process moves to step 515, place and route. If, on the other hand, the total clock skew is too long, then the delay elements (e.g., delay element 410A–I) are modified to balance the clock branches (step 512), as explained below.

The total estimated clock skew of clock tree 400 (FIG. 4) is apparent from Table 2. The fastest destination circuit is associated with clock branch C and responded in about 7,300 ps. The slowest destination circuit is associated with clock branch L and responded in about 8,850 ps. Thus, the overall clock skew of clock tree 400 is estimated to be about 8,850 ps minus 7,300 ps, or about 1,550 ps.

In an embodiment in which the clock-to-out time of the destination circuits (flip-flops) for use with clock tree 400 is about 1,500 ps, the total clock skew of clock tree 400 is preferably maintained below 1,500 ps. This ensures that all of the destination circuits will operate with correct functional and timing relationships. Thus, the overall clock skew of 1,550 ps depicted in Table 2 is unacceptable, and will likely lead to a timing error. Clock branches A–M should therefore be adjusted to reduce the overall clock skew. The process of FIG. 5A thus moves to step 512.

In step 512, netlist 505 is edited to change the delay associated with one or more of delay elements 410A–I. Referring to Table 2 above, the overall clock skew can be reduced, for example, by moving the delays associated with clock branches A, C, D, K, and M to the right (i.e., increasing their delays). Referring back to FIG. 4, the delays associated with clock branches A, C, D, K, and M can be increased by modifying delay elements 410A, 410D, 410F, and 410I. This can be accomplished by adding or subtracting delay-inducing components, or by substituting delay elements for different components. These modifications are made by editing netlist 510 to modify, remove, or replace one or more hard library elements associated with delay elements 410A–I. The stopper cells of delay elements 410A–I are not modified so that the routing to and from the delay elements is preserved.

For illustrative purposes, increasing the delay induced by a given delay element is assumed to add 250 ps of delay. Referring to FIG. 4, adding 250 ps of delay to delay element 410A moves clock branches A–J five 50-picosecond places to the right, as compared with the data of Table 2. Adding 250 ps of delay to delay element 410D moves clock branches B and C an additional five places to the right, increasing the delay of those branches by a total of 500 ps. Finally, adding 250 ps of delay to delay elements 410F and 410I moves each of clock branches K and M five places to the right.

Table 3 shows the skew data developed in steps 508 and 510 for clock tree 400 after increasing the delays associated with delay elements 410A, 410D, 410F, and 410I by

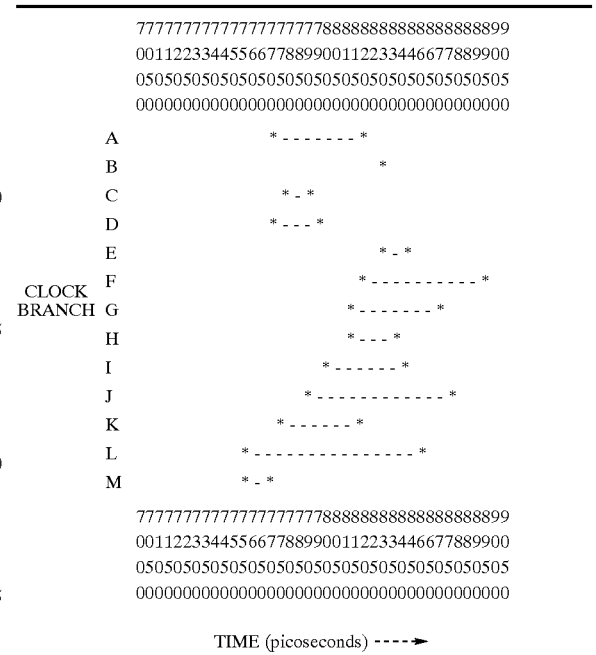

TABLE 3

The foregoing delay adjustments reduced the total skew of clock tree 400 to the skew associated with clock branch L. That is, the total clock skew is about 8,850−7,650=1,200 ps. The total clock skew of clock tree 400 was 1,550 ps before delay elements 410A–I were modified to reduce the skew. As discussed above, the maximum allowable clock skew was assumed to be 1,500 ps, and so clock tree 400 was deemed unacceptable in step 511. However, the modifications of delay elements 410A, 410B, 410D, 410F, and 410I reduced the total skew to an acceptable 1,220 ps. Thus, the modified specification will now pass the test of step 511 and the process will move to step 515, place and route.

At step 515, a place and route tool is used to place and route netlist 510. The particular paths between clock terminal CLK and each destination are automatically established through the respective delay elements by the place and route tool. Step 515 produces a circuit specification 520 in the form of e.g. a CIF or GDSII Stream.

Specification 520 includes interconnect data. Timing simulations of specification 520 consequently result in more accurate predictions than were achieved in step 508. Unfortunately, this means that netlist 505 can have unacceptable skew even though passing the test of step 511. Specification 520 is therefore tested to determine whether the total skew falls below the required minimum with routing in place.

In step 525, a delay calculator calculates the delays associated with the various signal paths defined by circuit specification 520, including each clock path defined between clock terminal CLK and a destination circuit. The delay calculator includes parameters specific to a particular fabrication recipe, and is therefore typically provided by the ASIC foundry employed to fabricate circuit specification 520. The delay calculator produces a delay file 530 (the Standard Delay Format, SDF, is widely used).

Circuit specification 520 provides a complete physical description of integrated circuit 106 implemented in the target technology; delay file 530 provides the timing data for circuit specification 520. Circuit specification 520 can therefore be back-annotated with the delay information in delay file 530 to simulate the operation of the circuit design in the target technology.

In step 535, stimulus file 507 (created in step 506) is applied to the circuit specification 520 back-annotated to include the delay information from delay file 530. The simulation results are then logged as described above in connection with step 508 to create a new log file 540. As compared with log file 509, log file 540 should be more accurate due to the inclusion of better estimates of interconnect delays.

Log file 540 is simplified in the manner discussed above in connection with step 510 to produce skew data 547. The format of skew data 547 (not shown) is similar to the skew data of Tables 1 and 2, but the data will be somewhat different due to the added precision provided by delay file 530.

The next step 550 is to determine, from skew data 547, whether the total clock skew is sufficiently short. If so, then netlist specification 520 is deemed appropriate for fabrication and is therefore output as a new circuit specification 555. If, on the other hand, the total clock skew is too long, then the delay elements are modified to balance the clock branches (step 560), as explained above in connection with step 512. Stopper cells associated with the modified delay elements serve as place holders to maintain the nets to and/or from the modified delay elements. The process then returns to step 515, place and route.

Conventional routing tools reroute nets associated with components that are modified, removed, or replaced. Modifying delay elements to balance signal paths can therefore initiate a reroute that introduces new timing errors. The use of stopper cells (e.g., stopper cells 430 and 440 of FIG. 4) solves this problem. Each delay element is bounded on either or both ends by a stopper cell. The stopper cells maintain the nets to and/or from the delay elements so that modifying a delay element does not affect the routing to and from the delay element. The connections between stopper cells and modified delay components within modified delay elements are rerouted. However, the netlist includes regional constraints that instruct the place and route tool to maintain the components within each delay element in close proximity to maintain short connections between components. In one embodiment, the regional constraints are data assigning a heavy "weight" to the specified connection. The netlist may also include routing constraints that instruct the router not to route through the delay elements to preserve die area in case additional area is needed for a delay-element modification. Regional and routing constraints are well understood in the art.

The above process should eventually produce a specification 520 that passes the test of step 550. If not, then conventional routing techniques are employed to correct any remaining skew problems. The resulting new specification 555 is then functionally tested using conventional test vectors. If specification 555 passes these functional tests, specification 555 is then used to fabricate the converted circuit design in the target technology.

In one embodiment, the invention is employed to convert a PLD circuit design to a gate-array design. Logic circuits implemented on gate arrays are typically designed using libraries of pre-designed logic elements (e.g. multiplexers, flip-flops, and logic gates) known as "library elements," typically defined using a number of more basic elements. The library elements are instantiated on rectangular areas of silicon, typically having the same height and different widths. Library elements fit together, like floor tiles, with groups of elements fitting together horizontally to form rows. The elements are connected together using metal interconnect layers.

As discussed above, delay elements 410A–I are collections of library elements. Clock tree 400 is balanced by reducing or increasing the delays associated with the delay elements. To allow for such adjustments, the library elements adjacent stopper cells in delay elements 410A–I are defined fairly large to preserve die area. Each delay element may then be modified, as needed, by altering the component bounded by stopper cells. The delay of a given delay element can be reduced, for example, by replacing a large, slow buffer with a smaller, faster buffer, or can be increased by replacing a small, fast buffer with a larger, slower buffer. Then, because the associated stopper cells are not altered, subsequent routing steps retain the nets to and/or from the modified delay element.

Figure 6:
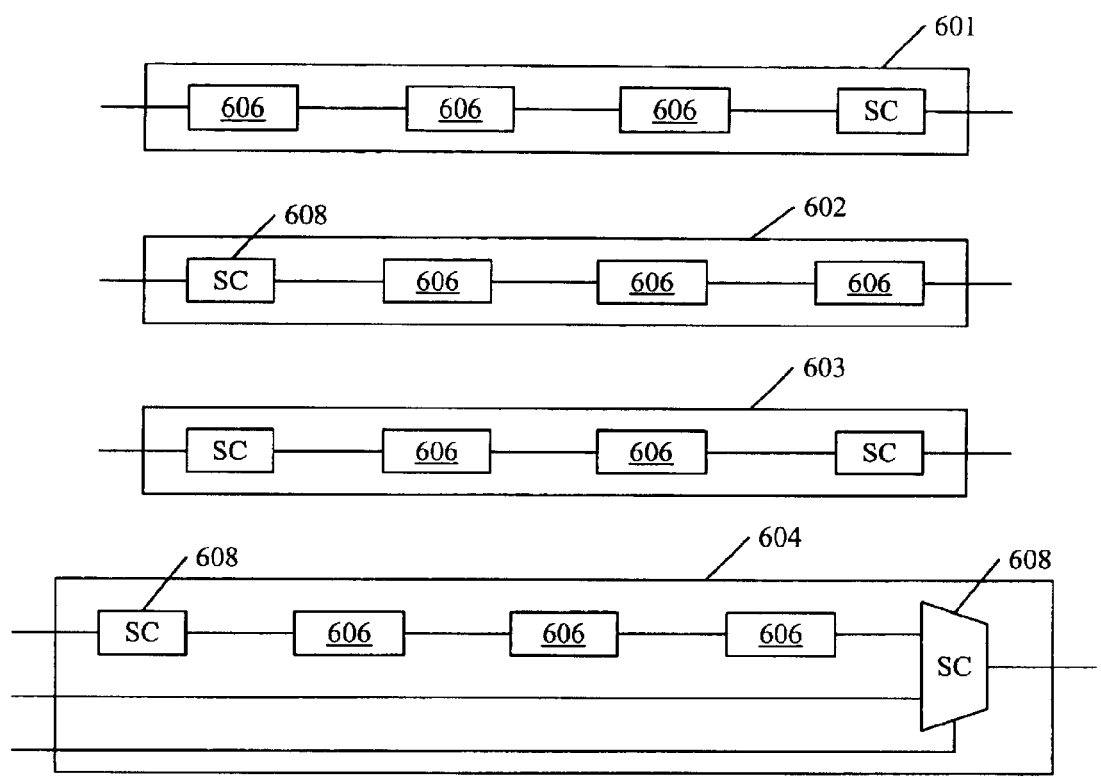
FIG. 6 depicts four exemplary delay elements 601–604.

FIG. 6 depicts four exemplary delay elements 601–604. Delay elements 601–604 include combinations of delay-inducing components 606 extending from or between stopper cells 608. Delay-inducing components 606 can be any circuit element, e.g., a buffer or inverter, that induces an appropriate delay into the signal path of interest. A stopper cell can be any circuit component inserted into a netlist and labeled in such a way as to prevent the component from being modified, and therefore to preserve a routed connection to and/or from the stopper cell.

Each stopper cell and delay element introduces some delay into the associated signal path. In some cases, this delay should be as small as possible. For example, where the delay associated with a given signal path should be minimized to reduce skew, or where a stopper cell is required to force a place-and-route tool to route a given signal through a predetermined physical location. In such situations, the present invention employs a novel stopper cell that occupies very little area and introduces a minimal amount of delay.

Figures 7A, 7B, 7C:
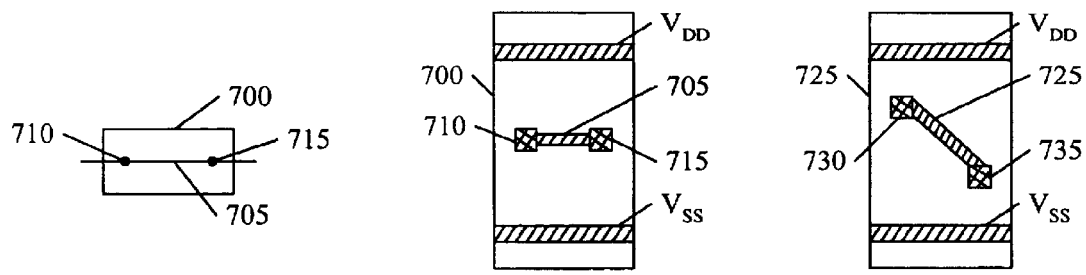
FIG. 7A depicts one embodiment of a stopper cell 700 in accordance with the invention that has a minimal impact on die area and signal propagation delay.
FIG. 7B depicts an example of how stopper cell 700 is physically instantiated in a gate array.
FIG. 7C depicts a stopper cell 720 in accordance with another embodiment of the invention.

FIG. 7A depicts one embodiment of a stopper cell 700 that has a minimal impact on die area and signal propagation delay. Stopper cell 700 is a library element that defines a conductive segment 705 used to hold the place of a selected line segment, and is depicted graphically as wire segment 705 extending between a pair of ports 710 and 715. Conductive segment 705 does not connect to any active circuit components within the bounds of stopper cell 700.

FIG. 7B depicts an example of how stopper cell 700 is physically instantiated in a gate array. In addition to the elements described in connection with FIG. 7A, stopper cell 700 conventionally includes a pair of power conductors VDD and VSS for conveying power-supply voltages through stopper cell 700. The following is a LEF text specification of stopper cell 700. LEF, for "library exchange format, is a common industry standard format. Ports 710 and 715 allow stopper cell 700 to connect to other cells.

```

# HOLE is the cut layer between metal-1 and metal-2
# CT is the via between field and metal-1 through CONT (cut layer)

# ADDED VIA AD for METAL 1 ACCESS PIN
VIA AD
# RESISTANCE 0.4;                    |
  LAYER ALA;
  RECT -1.2 -1.2 1.2 1.2;
# LAYER HOLE ;                       |   -->    can be used to create
# RECT -0.5 -0.5 0.5 0.5;            |          Metal 2 accessible pin
# LAYER ALB;                         |
# RECT -1.2 -1.2 1.2 1.2;            |
  END AD

MACRO WSTP
    CLASS CORE ;
    FOREIGN WSTP -1.8 -1.8 ;
    SIZE 18.0 BY 50.4 ;
    SITE BCP 0 0 N DO 1 BY 1 STEP 14.4 50.4 ;
```

```
-continued

SITE BCN 0 25.2 N DO 1 BY 1 STEP 14.4 50.4 ;
ORIGIN 1.8 1.8 ;
PIN A DIRECTION INPUT ;
    USE SIGNAL ;
    PORT
        LAYER ALA ;
        VIA 3.6 25.2 AD ;
        END
END A
PIN X DIRECTION OUTPUT ;
    USE SIGNAL ;
    PORT
        LAYER ALA ;
        VIA 10.8 25.2 AD ;
        END
END X
PIN VDD DIRECTION INOUT ;
    USE POWER ;
    SHAPE ABUTMENT ;
    PORT
        LAYER ALA ;
        WIDTH 2.4 ;
            PATH 0.0 10.8 14.4 10.8 ;
        VIA 0.0 10.8 CT ;
        VIA 7.2 10.8 CT ;
        VIA 14.4 10.8 CT ;
        END
END VDD
PIN VSS DIRECTION INOUT ;
    USE GROUND ;
    SHAPE ABUTMENT ;
    PORT
    LAYER ALA ;
    WIDTH 2.4 :
        PATH 0.0 36.0 14.4 36.0 ;
    VIA 0.0 36.0 CT ;
    VIA 7.2 36.0 CT
    VIA 14.4 36.0 CT
    END
END VSS
OBS
    LAYER ALA ;
    PATH 3.6 25.2
    END
END WSTP
```

The simplicity of stopper cell 700 allows stopper cell 700 to be made very small, thus minimizing the die area required to maintain the physical location of a given line segment. Other stopper cells can be used as place holders in optimizing networks in accordance with the invention. For example, buffers, inverters, or multiplexers can also be stopper cells.

Stopper cell 700 is faster than conventional library elements because stopper cell 700 is not logic. Stopper cell 700 is essentially a library element in which the defined component is a conductor. As discussed above, stopper cell 700 can be added to a netlist to force a place-and-route tool to route a signal through a specified physical location on a die. Further, stopper cell 700 can be adapted to force a selected signal path to change metal layers, from layer one to layer two in a two-layer metalization process, for example.

FIG. 7C depicts a stopper cell 720 in accordance with another embodiment of the invention. Stopper cell 720 is similar to stopper cell 700 of FIG. 7B, but includes a conductive segment 725 that joins a pair of ports 730 and 735 at a 45-degree angle. Stopper 720 may be used, for example, to join horizontal and vertical routing segments. For more information on stopper cells for use in accordance with the invention, see U.S. Pat. No. 6,308,309 entitled "Place-holding Library Elements for Defining Routing Paths," by Andy Gan and Glenn A. Baxter, issued Oct. 23, 2001, which is incorporated herein by reference.

While the present invention has been described in connection with specific embodiments, variations of these embodiments will be obvious to those of ordinary skill in the art. For example, 1. while the present invention is illustrated using exemplary clock trees, the invention is also applicable to other types of signal paths, such as data paths;

2. in another embodiment, the individual clock branches are aligned by finding and plotting the mean destination delay for each branch. The branch delays are then altered, as discussed above, to align the timing of the mean delay values.

Moreover, some components are shown directly connected to one another while others are shown connected via intermediate components. In each instance the method of interconnection establishes some desired electrical communication between two or more circuit nodes (e.g., lines or terminals). Such communication may often be accomplished using a number of circuit configurations, as will be understood by those of skill in the art. Therefore, the spirit and scope of the appended claims should not be limited to the foregoing description.

What is claimed is:

1. A method of converting a first network representation adapted for use in a programmable logic device into a second network representation, wherein the first network representation describes an input node connected to a first destination circuit via a first signal path and connected to a second destination circuit via a second signal path, the method comprising:

1. inserting a first macro in the first signal path, the first macro including a first delay-element representation and a first stopper-cell representation;

2. inserting a second macro in the second signal path, the second macro including a second delay-element representation and a second stopper-cell representation;

3. simulating a first signal traversing the first signal path and a second signal traversing the second signal path;

4. logging a first simulated delay for signals traversing the first signal path;

5. logging a second simulated delay for signals traversing the second signal path;

6. comparing the first and second simulated delays to find the difference between the first and second simulated delays; and 7. substituting the first delay-element representation with a third delay-element representation to reduce the difference between the first and second simulated delays.

2. The method of claim 1, wherein the second representation is adapted for use in a mask-programmed integrated circuit.

3. The method of claim 1, wherein the first delay-element representation defines a first circuit component and the third delay-element representation defines a second circuit component, and wherein the third circuit component induces less signal propagation delay than does the first circuit component.

4. The method of claim 1, wherein the first and second delay elements are library elements that define active semiconductor components.

5. The method of claim 1, wherein the first and second stopper cells define only inactive circuit components.

6. The method of claim 1, wherein the first delay-element representation defines at least one of a buffer and an inverter.

* * * * *